(12) United States Patent
Gu et al.

(10) Patent No.: US 12,323,258 B2
(45) Date of Patent: Jun. 3, 2025

(54) POWER SUPPLY DETECTION APPARATUS AND METHOD FOR DETECTING POWER TO A POWER OVER ETHERNET DEVICE

(71) Applicant: Huawei Technologies Co., Ltd., Shenzhen (CN)

(72) Inventors: Chao Gu, Nanjing (CN); Jian Xiang, Nanjing (CN); Donghui Wang, Nanjing (CN); Guirong Ji, Shenzhen (CN); Shiyong Fu, Shenzhen (CN); Rui Hua, Shenzhen (CN)

(73) Assignee: HUAWEI TECHNOLGOIES CO., LTD., Shenzhen (CN)

( * ) Notice: Subject to any disclaimer, the term of this patent is extended or adjusted under 35 U.S.C. 154(b) by 128 days.

(21) Appl. No.: 18/064,024

(22) Filed: Dec. 9, 2022

(65) Prior Publication Data
US 2023/0107236 A1 Apr. 6, 2023

Related U.S. Application Data

(63) Continuation of application No. PCT/CN2021/099468, filed on Jun. 10, 2021.

(30) Foreign Application Priority Data

Jun. 10, 2020 (CN) .......................... 202010522956.3

(51) Int. Cl.
H04L 12/10 (2006.01)
(52) U.S. Cl.
CPC ................... H04L 12/10 (2013.01)

(58) Field of Classification Search
CPC ... H04L 12/10; H04L 12/40045; G01R 31/40; G01R 31/52; G01R 31/54; G01R 27/02
See application file for complete search history.

(56) References Cited

U.S. PATENT DOCUMENTS 5,903,613 A * 5/1999 Ishida ................. H04L 25/0272
370/242
2006/0128319 A1* 6/2006 Van de Water ......... H04L 12/10
455/73

(Continued)

FOREIGN PATENT DOCUMENTS

CN 101112042 A 1/2008
CN 101371492 A 2/2009

(Continued)

Primary Examiner — Danny Chan
(74) Attorney, Agent, or Firm — Conley Rose, P.C.

(57) ABSTRACT

A power supply detection apparatus includes a power sourcing equipment (PSE) circuit, a power supply module, and a reverse circuit. The PSE circuit is configured to send a first sounding electrical signal and a second sounding electrical signal to the reverse circuit. The reverse circuit outputs the first sounding electrical signal to a wire-pair group of an Ethernet cable, performs reverse processing on the second sounding electrical signal, and outputs a reverse-processed second sounding electrical signal to the wire-pair group. The PSE circuit is configured to determine, using the first sounding electrical signal, a forward sounding result of a to-be-detected device; and determine a reverse sounding result of the to-be-detected device based on the second sounding electrical signal. The power supply detection apparatus is configured to determine that the to-be-detected device is a non-PD when the forward sounding result or the reverse sounding result is a short circuit.

18 Claims, 7 Drawing Sheets

(56) References Cited

U.S. PATENT DOCUMENTS

| | | | |
|---|---|---|---|
| 2006/0164062 A1* | 7/2006 | Stineman | H04L 12/10 324/76.11 |
| 2007/0165345 A1 | 7/2007 | Woo | |
| 2008/0238656 A1 | 10/2008 | De La Torre Vega et al. | |
| 2010/0042855 A1* | 2/2010 | Karam | G06F 1/26 713/300 |
| 2010/0201188 A1* | 8/2010 | Robbins | H04L 12/10 307/1 |
| 2011/0258464 A1* | 10/2011 | Gammel | H04L 12/40045 713/300 |
| 2012/0011380 A1* | 1/2012 | Dove | G06F 1/26 713/300 |
| 2014/0084681 A1 | 3/2014 | Vigna et al. | |
| 2014/0136874 A1 | 5/2014 | Diab et al. | |
| 2014/0172133 A1* | 6/2014 | Snyder | H04L 12/12 700/90 |
| 2015/0145324 A1 | 5/2015 | Heath et al. | |
| 2016/0241406 A1* | 8/2016 | Darshan | H04L 12/10 |
| 2016/0315780 A1 | 10/2016 | Balasubramanian et al. | |
| 2017/0010645 A1 | 1/2017 | Jain et al. | |
| 2019/0068386 A1* | 2/2019 | Fu | G06F 1/266 |
| 2019/0229934 A1* | 7/2019 | Zhuang | G06F 1/266 |
| 2019/0331741 A1* | 10/2019 | Hittel | G01R 31/40 |
| 2020/0092118 A1* | 3/2020 | Zhuang | H04L 12/10 |
| 2022/0329449 A1* | 10/2022 | Fu | H04L 12/10 |

FOREIGN PATENT DOCUMENTS

| | | |
|---|---|---|
| CN | 103067182 A | 4/2013 |
| CN | 103595575 A | 2/2014 |
| CN | 103825748 A | 5/2014 |
| CN | 103888272 A | 6/2014 |
| CN | 105629098 A | 6/2016 |
| CN | 109617039 A | 4/2019 |
| CN | 208862853 U | 5/2019 |
| CN | 110514932 A | 11/2019 |
| EP | 2529507 A1 | 12/2012 |
| EP | 3182641 A1 | 6/2017 |
| WO | 2008135774 A1 | 11/2008 |
| WO | 2011093897 A1 | 8/2011 |

* cited by examiner

POWER SUPPLY DETECTION APPARATUS AND METHOD FOR DETECTING POWER TO A POWER OVER ETHERNET DEVICE

CROSS-REFERENCE TO RELATED APPLICATIONS

This application is a continuation application of International Application No. PCT/CN2021/099468, filed on Jun. 10, 2021, which claims priority to Chinese Patent Application No. 202010522956.3, filed on Jun. 10, 2020. The disclosures of the aforementioned applications are hereby incorporated by reference in their entireties.

TECHNICAL FIELD

This application relates to the field of power over Ethernet, and in particular, to a power supply detection apparatus and method and a computer program product thereof.

BACKGROUND

Power over Ethernet (PoE) needs to use two or four pairs of copper wires in a PoE twisted pair according to a regulation in a standard. Power sourcing equipment (PSE) supplies power to a powered device (PD).

As shown in FIG. 1, PSE outputs a sounding electrical signal to a to-be-detected device through a wire pair group, detects electrical parameters (for example, a voltage and a current) on the to-be-detected device in a process of receiving the sounding electrical signal by the to-be-detected device, and calculates a resistance value or a capacitance value of the to-be-detected device. When it is determined that the resistance value or the capacitance value on the to-be-detected device is within a valid PD range, it may be determined that the to-be-detected device is a PD. In this case, the PSE can normally supply power to the PD. If the resistance value or the capacitance value exceeds the range, it is determined that the to-be-detected device is a non-PD. In this case, the PSE cannot supply power to the device.

In a scenario in which two PSEs are connected, PSE A is powered on, and PSE B is not powered on, when the PSE A sends a sounding electrical signal to the PSE B, because the PSE B is not powered on and a component inside the PSE B is equivalent to a load, it is probabilistic to detect that a resistance value or a capacitance value on a to-be-detected device is within the valid PD range. In this case, the PSE A may mistakenly determine that the PSE B is a PD, the PSE A may further normally supply power to the PSE B, and the PSE B may be damaged.

Therefore, detection accuracy in the foregoing scenario is low, and power supply is not safe.

SUMMARY

This application provides a power supply detection apparatus and method and a computer program product thereof, to improve detection accuracy and ensure power supply safety of a device.

According to a first aspect, an embodiment of this application provides a power supply detection apparatus. The apparatus may be connected to a powered device through a wire pair group of a PoE cable, to detect whether a to-be-detected device is a PD. In an example, the detection apparatus may include a PSE circuit, a power supply module, and a reverse circuit.

The power supply module may be connected to the PSE circuit, and the PSE circuit may be connected to the reverse circuit.

The power supply module may be configured to supply power to the PSE circuit. The PSE circuit is configured to send a first sounding electrical signal and a second sounding electrical signal to the reverse circuit. The reverse circuit is configured to directly output the first sounding electrical signal to the wire pair group of the PoE cable, perform reverse processing on the second sounding electrical signal, and output a second sounding electrical signal obtained after reverse processing to the wire pair group. The PSE circuit is further configured to determine, based on the first sounding electrical signal, a forward sounding result of the to-be-detected device connected to the PoE cable, and determine a reverse sounding result of the to-be-detected apparatus based on the second sounding electrical signal. The power supply detection apparatus is configured to determine that the to-be-detected device is a non-PD when the forward sounding result or the reverse sounding result is a short circuit. A sounding result includes any one of the following: a PD, a non-PD, or a short circuit. The first sounding electrical signal includes but is not limited to a first electrical parameter and a second electrical parameter.

The first electrical parameter of the first sounding electrical signal is equal to a first electrical parameter of the second sounding electrical signal, and the second electrical parameter of the first sounding electrical signal is equal to a second electrical parameter of the second sounding electrical signal.

Further, a polarity of the first sounding electrical signal is opposite to that of the second sounding electrical signal obtained after reverse processing. That the polarity of the first sounding electrical signal is opposite to that of the second sounding electrical signal obtained after reverse processing may have a meaning as follows: The reverse circuit is connected to the wire pair group of the PoE cable, and in two ports that output the first sounding electrical signal and that are in the reverse circuit, a port that outputs a high electric potential is connected to a first wire pair in the wire pair group, and a port that outputs a low electric potential is connected to a second wire pair in the wire pair group. In two ports that output the second sounding electrical signal obtained after reverse processing and that are in the reverse circuit, a port that outputs a high electric potential is connected to the second wire pair in the wire pair group, and a port that outputs a low electric potential is connected to the first wire pair in the wire pair group.

In the foregoing apparatus structure, two sounding electrical signals with opposite polarities may be provided for the to-be-detected device through the wire pair group, and whether the to-be-detected device is a PD is accurately determined based on sounding results obtained when the to-be-detected device bears the two sounding electrical signals with different polarities, to improve accuracy of a detection result and ensure power supply safety of a device.

In a possible design, the reverse circuit is configured to receive a control signal from the PSE circuit, and perform reverse processing on the second sounding electrical signal in response to the control signal.

In the foregoing apparatus structure, the reverse circuit may span between the wire pair group and the PSE circuit. The reverse circuit outputs, under control of the control signal sent by the PSE circuit, the two sounding electrical signals with opposite polarities to the to-be-detected device, to meet a requirement of outputting the sounding electrical signals.

In a possible design, the reverse circuit in this embodiment of this application may include a first optical coupler and a second optical coupler.

A first input port of the first optical coupler is connected to the PSE circuit, a second input port of the first optical coupler is connected to a ground, a first end point of a first output port of the first optical coupler is connected to the first wire pair in the wire pair group, a second end point of the first output port of the first optical coupler is connected to a port that outputs a high electric potential and that is in power supply output ports of the PSE circuit, a first end point of a second output port of the first optical coupler is connected to the port that outputs a high potential and that is in the power supply output ports of the PSE circuit, and a second end point of the second output port of the first optical coupler is connected to the second wire pair in the wire pair group. A first input port of the second optical coupler is connected to the PSE circuit, a second input port of the second optical coupler is connected to the ground, a first end point of a first output port of the second optical coupler is connected to the second wire pair, a second end point of the first output port of the second optical coupler is connected to a port that outputs a low electric potential and that is in the power supply output ports of the PSE circuit, a first end point of a second output port of the second optical coupler is connected to the port that outputs a low potential and that is in the power supply output ports of the PSE circuit, and a second end point of the second output port of the second optical coupler is connected to the first wire pair.

In the foregoing apparatus structure, the received control signal of a PSE signal may be used to change connections between the wire pair group and different output port points of the two optical couplers, to output sounding electrical signals with different polarities to the wire pair group, and perform sounding on the to-be-detected device.

In a possible design, the power supply detection apparatus provided in the first aspect of embodiments of this application may further include a diode.

An anode of the diode is connected to the PSE circuit, and a cathode of the diode is connected to the power supply module.

In the foregoing apparatus structure, a short circuit between the PSE circuit and the power supply module can be avoided by using the diode, so that the PSE circuit and the power supply module are protected.

In a possible design, the power supply detection apparatus provided in the first aspect of embodiments of this application may further include a processor. The processor may be connected to the PSE circuit.

The processor may be configured to obtain the forward sounding result and the reverse sounding result from the PSE circuit, and determine that the to-be-detected device is a non-PD when the forward sounding result or the reverse sounding result is that the to-be-detected device is short-circuited.

In the foregoing apparatus structure, because the PSE circuit cannot determine, based on the foregoing two sounding results, whether the to-be-detected device is a PD device, if the PSE circuit needs to implement the foregoing function, a program in the PSE circuit needs to be modified. To rapidly implement the foregoing function, the processor may be disposed to control the PSE circuit to determine whether the to-be-detected device is a PD.

In a possible design, the processor may be further configured to indicate the reverse circuit to perform reverse processing on the second sounding electrical signal.

In the foregoing apparatus structure, a time point at which a sounding electrical signal is sent to the wire pair group and a polarity of the sounding electrical signal may be accurately controlled under control of the processor.

According to a second aspect, an embodiment of this application provides a power supply chip. The power supply chip may include the power supply detection apparatus provided in the first aspect of embodiments of this application, and the power supply detection apparatus includes a PSE circuit, a power supply module, and a reverse circuit.

The power supply module is connected to the PSE circuit, and the power supply module is configured to supply power to the PSE circuit. The PSE circuit is connected to the reverse circuit, and the PSE circuit is configured to send a first sounding electrical signal and a second sounding electrical signal. The reverse circuit is configured to directly output the first sounding electrical signal to a wire pair group of an Ethernet cable, perform reverse processing on the second sounding electrical signal, and output a second sounding electrical signal obtained after reverse processing to the wire pair group. The PSE circuit is further configured to: determine, based on the first sounding electrical signal, a forward sounding result of a to-be-detected device connected to the Ethernet cable, where the sounding result is any one of the following: a powered device PD, a non-PD, and a short circuit; and determine a reverse sounding result of the to-be-detected device based on the second sounding electrical signal. The power supply detection apparatus is configured to determine that the to-be-detected device is a non-PD when the forward sounding result or the reverse sounding result is a short circuit.

According to a third aspect, an embodiment of this application further provides a power supply detection method. The detection method may be performed by a network device in PoE in embodiments of this application. The network device may be the power supply detection apparatus provided in the first aspect of this application. The method includes the following.

The network device sends a forward sounding electrical signal to a wire pair group of a PoE cable connected to the network device, and determines, based on the forward sounding electrical signal, a forward sounding result of a to-be-detected device connected to the wire pair group. The sounding result includes any one of the following: PSE, a PD, and a to-be-detected short circuit.

The network device sends a reverse sounding electrical signal to the wire pair group, and determines a reverse sounding result of the to-be-detected device based on the reverse sounding electrical signal. The network device determines that the to-be-detected device is a non-PD when it is determined that the forward sounding result or the reverse sounding result is a short circuit.

In the foregoing method, when the PSE bears a sounding electrical signal whose polarity is opposite to that of an output port and the PSE is not powered on, the sounding electrical signal may be directly returned to the PSE through a diode disposed between a power supply module and a PSE circuit in the PSE. In this case, a sounding result is that the to-be-detected device is short-circuited. In an example, whether the to-be-detected device is the PD can be accurately determined by using two sounding results obtained when two sounding electrical signals with opposite polarities are provided for the to-be-detected device, to improve accuracy of a detection result and ensure power supply safety of a device.

According to a fourth aspect, an embodiment of this application provides a computer program product. When the computer program product is run by a PSE chip, the PSE chip is enabled to perform the following steps: sending a first sounding electrical signal and a first control signal, where the first control signal indicates a reverse circuit to directly output the first sounding signal; determining a forward sounding result based on the first sounding electrical signal, where the sounding result includes any one of the following: a PD, a non-PD, and a short circuit; sending a second sounding electrical signal and a second control signal, where the second control signal indicates the reverse circuit to perform reverse processing on the second sounding electrical signal; determining a reverse sounding result based on the second sounding electrical signal; and determining that a to-be-detected device is a non-PD when it is determined that the forward sounding result or the reverse sounding result is a short circuit.

In addition, for technical effects brought by any possible design manner in the fourth aspect, refer to the technical effects brought by the third aspect and any possible design manner in the third aspect. Details are not described herein again.

According to a fifth aspect, an embodiment of this application provides a computer program product. When the computer program product is run by a processor, the processor is enabled to perform the following steps: indicating a PSE circuit to send a first sounding electrical signal, and indicating a reverse circuit to directly output the first sounding electrical signal; obtaining a first sounding electrical signal-based forward sounding result from the PSE circuit, where the sounding result includes any one of the following: a PD, a non-PD, and a short circuit; indicating the PSE circuit to send a second sounding electrical signal, and indicating the reverse circuit to perform reverse processing on the second sounding electrical signal; obtaining a second sounding electrical signal-based reverse sounding result from the PSE circuit; and determining that a to-be-detected device is a non-PD when the forward sounding result or the reverse sounding result is a short circuit.

In addition, for technical effects brought by any possible design manner in the fifth aspect, refer to the technical effects brought by the third aspect and any possible design manner in the third aspect. Details are not described herein again.

DESCRIPTION OF EMBODIMENTS

In embodiments of this application, "or" describes an association relationship between associated objects, and represents that there may be two relationships. For example, "A or B" may represent the following cases: Only A exists, and only B exists. A and B may be singular or plural.

The term "connection" in this application describes a connection relationship between two objects, and may represent two connection relationships. For example, "A is connected to B" may represent the following cases: A is directly connected to B, and A is connected to B through C.

It should be noted that the words such as "first" and "second" in embodiments of this application are only used for a purpose of distinguishing descriptions, and cannot be understood as an indication or implication of relative importance, or as an indication or implication of a sequence.

A power supply detection apparatus provided in embodiments of this application may be applied to PoE, and is used as PSE in PoE to supply power to a PD in PoE.

Figure 1:
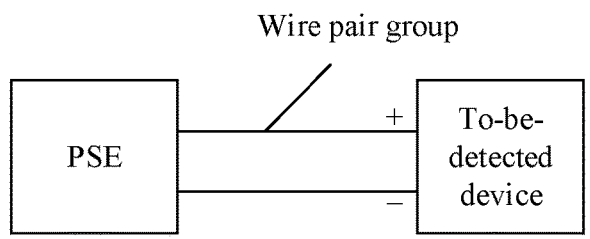
FIG. 1 is a schematic diagram of power supply of PSE according to an embodiment of this application.
Figure 2:
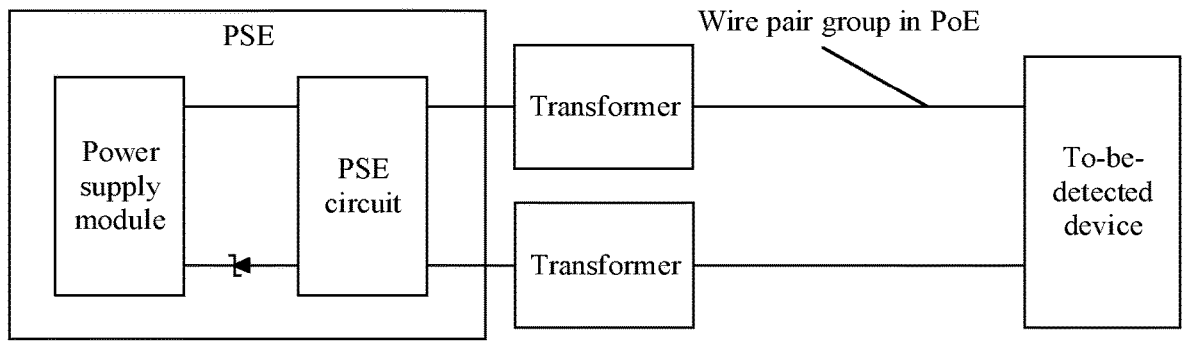
FIG. 2 is a schematic diagram 2 of power supply of sourcing equipment according to an embodiment of this application.

FIG. 2 is a diagram of a structure of PSE. The PSE shown in FIG. 2 includes a PSE circuit, a power supply module, and a protection diode. The power supply module may be connected to the PSE circuit. The PSE circuit may be connected to a wire pair group through a transformer, an anode of the protection diode is connected to the PSE circuit, and a cathode of the protection diode is connected to a power supply. The PSE circuit may be a PSE chip, or a combination of a PSE chip and another circuit component. The power supply module may be configured to supply power to the PSE circuit. The PSE circuit is configured to send sounding electrical signals of different magnitudes according to a regulation in a PoE standard, and output sounding electrical signals obtained after the sounding electrical signals are converted by the transformer to the wire pair group connected to a to-be-detected device. The PSE circuit calculates a resistance value or a capacitance value of the to-be-detected device based on a value of an electrical parameter of the wire pair group, and determines whether the to-be-detected device is a PD by using the resistance value or the capacitance value. For example, the PSE circuit sends a sounding voltage and measures a corresponding current, to calculate the resistance value or the capacitance value; or the PSE circuit sends a sounding current and measures a corresponding voltage, to calculate the resistance value or the capacitance value. A sounding electrical signal may include a plurality of sounding voltages, may include a plurality of sounding currents, or may include both a sounding voltage and a sounding current.

The following describes a process in which the sounding electrical signal is a voltage, and whether the to-be-detected device is a PD is determined by using the resistance value of the to-be-detected device. Details are as follows.

The PSE circuit sends one sounding voltage Vdetcet1 at a moment 1, and the PSE circuit reads that a current on the wire pair group connected to the to-be-detected device is Idetect1. The PSE circuit sends one sounding voltage Vdetcet2 at a moment 2, and the PSE circuit reads that a current on the wire pair group connected to the to-be-detected device is Idetect2, so that an obtained sounding resistance value of the to-be-detected device is as follows:

$$Rdetect = \frac{Vdetect1 - Vdetect2}{Idetect1 - Idetect2}.$$

When it is detected that Rdetect is within a PD resistance range of 19 kΩ to 26.5 kΩ in the PoE standard, it is determined that the to-be-detected device is a PD, and a power supply voltage is output to the PD to ensure normal operation of the PD.

However, in the foregoing PSE detection manner, when two devices PSE A and PSE B are interconnected, the device PSE A sends a sounding voltage V. If the PSE B is not powered on, a protection component in the device PSE B cannot operate, and because the power supply module or another apparatus has a leakage current, it is probabilistic to detect that R of the PSE B is within the range of 19 kΩ to 26.5 kΩ. In this case, the device PSE A may mistakenly determine that the PSE B is a PD, and the PSE A may further supply power to the PSE B, resulting in that the PSE B is damaged.

In an example, in a current detection manner of the to-be-detected device, detection accuracy is low and power supply is not safe.

To resolve the foregoing problems, embodiments of this application provide a power supply detection apparatus and method and a computer program product thereof, to improve detection accuracy and ensure power supply safety of a device.

Figure 3:
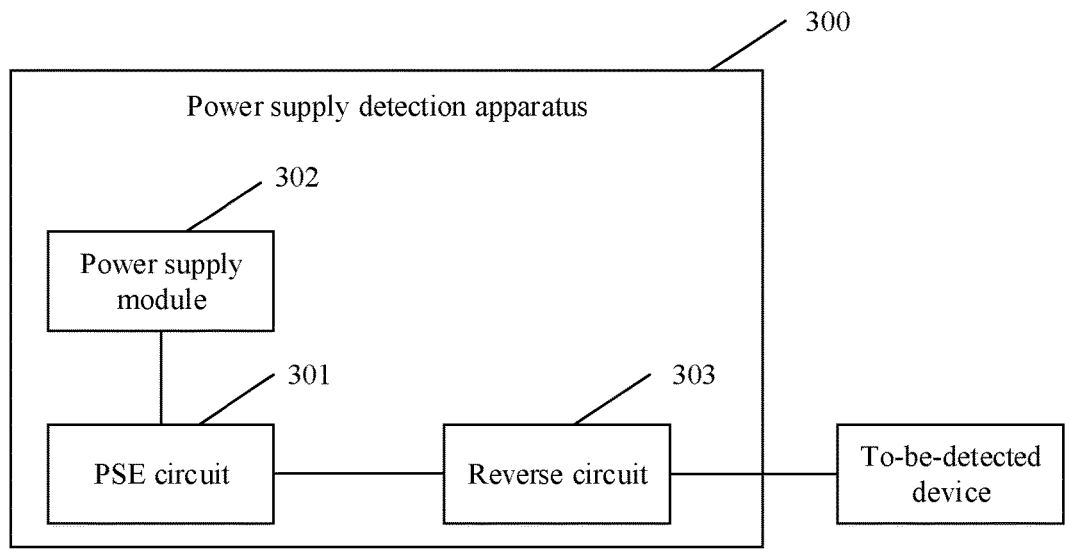
FIG. 3 is a schematic diagram of a structure of a power supply detection apparatus according to an embodiment of this application.

FIG. 3 is a schematic diagram of a structure of a power supply detection apparatus according to this application. The power supply detection apparatus 400 may be connected to a to-be-detected device, and is configured to detect the to-be-detected device and accurately determine whether the to-be-detected device is a PD, to avoid a device damage caused by supplying power to a non-PD and ensure power supply safety of the device. The power supply detection apparatus 300 may be electrically connected to the to-be-detected device through a wire pair group of a PoE cable.

As shown in FIG. 3, the power supply detection apparatus 300 may include a PSE circuit 301, a power supply module 302, and a reverse circuit 303.

The power supply module 302 may be connected to the PSE circuit 403, and the PSE circuit 401 may be connected to the reverse circuit 402.

The power supply module 302 may be configured to supply power to the PSE circuit, and the PSE circuit 301 may be configured to send a first sounding electrical signal and a second sounding electrical signal. The reverse circuit 303 may be configured to directly output the first sounding electrical signal to the wire pair group of the PoE cable, perform reverse processing on the second sounding electrical signal, and output a second sounding electrical signal obtained after reverse processing to the wire pair group. The PSE circuit 301 may be further configured to: after sending the first sounding electrical signal through the wire pair group, determine, based on the first sounding electrical signal, a forward sounding result of the to-be-detected device connected to the wire pair group in PoE; and after sending the second sounding electrical signal obtained after reverse processing through the wire pair group a reverse sounding result of the to-be-detected apparatus based on the second sounding electrical signal. The power supply detection apparatus 300 provided in this embodiment of this application may be configured to determine that the to-be-detected device is a non-PD when the forward sounding result or the reverse sounding result is a short circuit. A sounding result includes any one of the following: a PD, a non-PD, or a short circuit.

The first sounding electrical signal and the second sounding electrical signal each include at least two electrical parameters. The electrical parameter may be but is not limited to a voltage or a current.

A first electrical parameter in the first sounding electrical signal is equal to a first electrical parameter in the second sounding electrical signal, and a second electrical parameter in the first sounding electrical signal is equal to a second electrical parameter in the second sounding electrical signal. The first sounding electrical signal and the second sounding electrical signal may be direct-current (DC) voltage signals or DC current signals. For example, the sounding electrical signals are DC voltage signals. The first electrical parameter may be −9 V, and the second electrical parameter may be −4 V.

A PSE chip in the PSE circuit 301 may send the sounding electrical signals (the first sounding electrical signal and the second sounding electrical signal) by using a detection (D) pin, and measure responses of the sounding electrical signals by using a sensing (S) pin. Different PSE chips have different pin designs. The foregoing D pin and S pin are one of examples. The PSE chip may also cooperate with another circuit component in the PSE circuit 301, to send the sounding electrical signals. For example, if the D pin sends a voltage signal, the S pin measures a current generated by the voltage signal, and if the D pin sends a current signal, the S pin measures a voltage established by the current signal. Because the reverse circuit 402 changes only a direction of an electrical signal without changing another parameter, the S pin may be connected between the D pin and the reverse circuit 402, or may be connected behind the reverse circuit 402.

For example, after the first sounding electrical signal or the second sounding electrical signal obtained after reverse processing is sent to the wire pair group, when it is determined that a detected current value is greater than (or greater than or equal to) a preset current threshold or a detected resistance value is less than (or less than or equal to) a preset resistance threshold, it is determined that a sounding result of the to-be-detected device is a short circuit. The preset current threshold may be 5 milliamps (mA) or a value less than 5 mA (for example, 2 mA, 3 mA, or 4.9 mA), and the preset resistance threshold may be 500 Ω, 2 kiloohms (kΩ), or another value that is far less than a lower limit (19 kΩ) of a resistance value in an effective PD condition. In an example, values of the preset current threshold and the preset resistance threshold may be set based on an application scenario of the power supply detection apparatus.

Further, a polarity of the first sounding electrical signal is opposite to that of the second sounding electrical signal obtained after reverse processing. That the polarity of the first sounding electrical signal is opposite to that of the second sounding electrical signal obtained after reverse processing may have a meaning as follows. The reverse circuit 303 is connected to the wire pair group in PoE, and in two ports that output the first sounding electrical signal and that are in the reverse circuit 303, a port that outputs a high electric potential is connected to a first wire pair in the wire pair group, and a port that outputs a low electric potential is connected to a second wire pair in the wire pair group. Similarly, in two ports that output the second sounding electrical signal obtained after reverse processing and that are in the reverse circuit 303, a port that outputs a high electric potential is connected to the second wire pair in the wire pair group, and a port that outputs a low electric potential is connected to the first wire pair in the wire pair group.

During an example implementation, a transformer is connected between two output ports of the reverse circuit 303 and each wire pair of the wire pair group. The transformer converts an electrical signal received by a connected output port of the reverse circuit and outputs a converted electrical signal to a connected wire pair.

When the power supply detection apparatus 300 is configured to detect whether the to-be-detected device is a PD, the PSE circuit 301 sends the first sounding electrical signal, and the reverse circuit 303 separately outputs two electrical parameters in the first sounding electrical signal to the to-be-detected device by using two wire pairs in the wire pair group, and obtains the forward sounding result of the to-be-detected device. The PSE circuit 301 sends the second sounding electrical signal, and the reverse circuit 303 performs reverse processing on the second sounding electrical signal, and outputs two electrical signals in the second sounding electrical signal obtained after reverse processing to the to-be-detected device by using two wire pairs in the wire pair group, to obtain the reverse sounding result of the to-be-detected device. When it is determined that the forward sounding result or the reverse sounding result of the to-be-detected device is a short circuit, the power supply detection apparatus 300 determines that the to-be-detected device is a non-PD. A sounding result may include any one of the following: a PD, a non-PD, or a short circuit. The first sounding electrical signal and the second sounding electrical signal may be DC voltage signals or DC current signals.

In an example, when it is determined that the to-be-detected apparatus is a PD, the power supply detection apparatus 300 supplies power to the PD. In this case, the PSE circuit 301 may be used as a power supply to supply power to the PD.

During an example implementation, the power supply module 302 supplies power to the PSE circuit 301, and the PSE circuit 301 supplies power to the to-be-detected device.

In an example, the power supply module 302 supplies power to the to-be-detected device by supplying power to the PSE circuit 301 when it is determined that the to-be-detected device is the PD.

For example, the to-be-detected device may be but is not limited to a switch (switch), a wireless access point (WAP), an Internet Protocol (IP) phone set, a network camera, a router, or the like. The to-be-detected device may be but is not limited to a switch. The to-be-detected device obtains electric energy by using the wire pair group in PoE.

In this embodiment of this application, the PSE circuit 301 may send a control signal to the reverse circuit 403, to control the reverse circuit 403 to directly output the first sounding electrical signal to the wire pair group in PoE, and perform reverse processing on the second sounding electrical signal.

It should be understood that in the power supply detection apparatus 300 provided in this embodiment of this application, a diode may be disposed between the power supply module 302 and the PSE circuit 301. An anode of the diode may be connected to the PSE circuit 301. A cathode of the diode is connected to the power supply module 302. Due to a unidirectional conductivity of the diode, electric energy on the PSE circuit 301 cannot be output to the power supply module 302, so that the power supply module 302 is protected from being damaged due to bearing a reverse voltage.

In actual application, fixed interfaces may be disposed on the power supply detection apparatus 300 and the to-be-detected device, and the wire pair group in PoE may be directly inserted into the fixed interfaces on the power supply detection apparatus 300 and the to-be-detected device, so that the power supply detection apparatus 300 outputs the first sounding electrical signal and the second sounding electrical signal to the to-be-detected device, and supplies power to the to-be-detected device.

During an example implementation, the PSE circuit 301 may send the control signal to the reverse circuit 303. After receiving the control signal, the reverse circuit 303 performs reverse processing on the second sounding electrical signal in response to the control signal, respectively outputs two parameters in the second sounding electrical signal obtained after reverse processing to two wire pairs in the wire pair group by using the transformer, and directly outputs two electrical parameters in the first sounding electrical signal to the two wire pairs in the wire pair group by using the transformer. The PSE circuit 301 may further obtain the forward sounding result and the reverse sounding result of the to-be-detected device based on the sent first sounding electrical signal and the second sounding electrical signal obtained after reverse processing.

In this application, the foregoing function may be adjusted by using the PSE circuit 301. In some embodiments, the power supply detection apparatus 300 in this application may further include a processor. The processor is communicatively or electrically connected to the PSE circuit 301, to obtain the forward sounding result and the reverse sounding result from the PSE circuit 301, and the processor determines that the to-be-detected device is the non-PD when it is determined that the forward sounding result or the reverse sounding result is a short circuit.

In some embodiments of this application, the processor may further send an instruction signal to the PSE circuit 301, to indicate the PSE circuit 301 to control the reverse circuit 303 to perform reverse processing on the second sounding electrical signal, output the second sounding electrical signal obtained after reverse processing to the wire pair group, and directly output the first sounding electrical signal to the wire pair group.

In some other embodiments of this application, the processor may be connected to the reverse circuit 303, and output a control signal to the reverse circuit 303. In response to the control signal, the reverse circuit 303 directly outputs the first sounding electrical signal to the wire pair group or performs reverse processing on the second sounding electrical signal, and outputs the second sounding electrical signal obtained after reverse processing to the wire pair group.

During an example implementation, the processor may be any one of a microcontroller (also referred to as a microcontroller unit (MCU)), a central processing unit (CPU), or a digital signal processor (DSP). The specific form of the processor is not limited to the foregoing examples.

Optionally, the PSE circuit 301, the power supply module 302, and the reverse circuit 303 in the power supply detection apparatus 200 may be integrated into a chip in a form of an integrated circuit, and the processor may be connected to the integrated circuit.

The following describes an example structure of the reverse circuit 303 in the power supply detection apparatus 300.

The reverse circuit 303 is connected to the PSE circuit 301 and the wire pair group in PoE, and is configured to directly output to the wire pair group the first sounding electrical signal sent by the PSE circuit 301, perform reverse processing on the second sounding electrical signal sent by the PSE circuit 301, and output the second sounding electrical signal obtained after reverse processing to the wire pair group. The polarity of the first sounding electrical signal is opposite to that of the second sounding electrical signal obtained after reverse processing.

In an example, the reverse circuit 303 receives the control signal from the PSE circuit 301, performs reverse processing on the second sounding electrical signal in response to the control signal, outputs the second sounding electrical signal obtained after reverse processing to the wire pair group, and directly outputs the first sounding electrical signal to the wire pair group.

During an example implementation, the two output ports of the reverse circuit 303 are separately connected to one wire pair by using one transformer.

The reverse circuit 303 may include a first optical coupler (OC) and a second OC.

In an example, a first input port of the first optical coupler is connected to the PSE circuit, a second input port of the first optical coupler is connected to a ground, a first end point of a first output port of the first optical coupler is connected to a first wire pair in the wire pair group, a second end point of the first output port of the first optical coupler is connected to a port that outputs a high electric potential and that is in power supply output ports of the PSE circuit, a first end point of a second output port of the first optical coupler is connected to the port that outputs a high potential and that is in the power supply output ports of the PSE circuit, and a second end point of the second output port of the first optical coupler is connected to a second wire pair in the wire pair group. A first input port of the second optical coupler is connected to the PSE circuit, a second input port of the second optical coupler is connected to the ground, a first end point of a first output port of the second optical coupler is connected to the second wire pair, a second end point of the first output port of the second optical coupler is connected to a port that outputs a low electric potential and that is in the power supply output ports of the PSE circuit, a first end point of a second output port of the second optical coupler is connected to the port that outputs a low potential and that is in the power supply output ports of the PSE circuit, and a second end point of the second output port of the second optical coupler is connected to the first wire pair.

For ease of understanding, the following provides an example of the reverse circuit 303 provided in this embodiment of this application.

Figure 4:
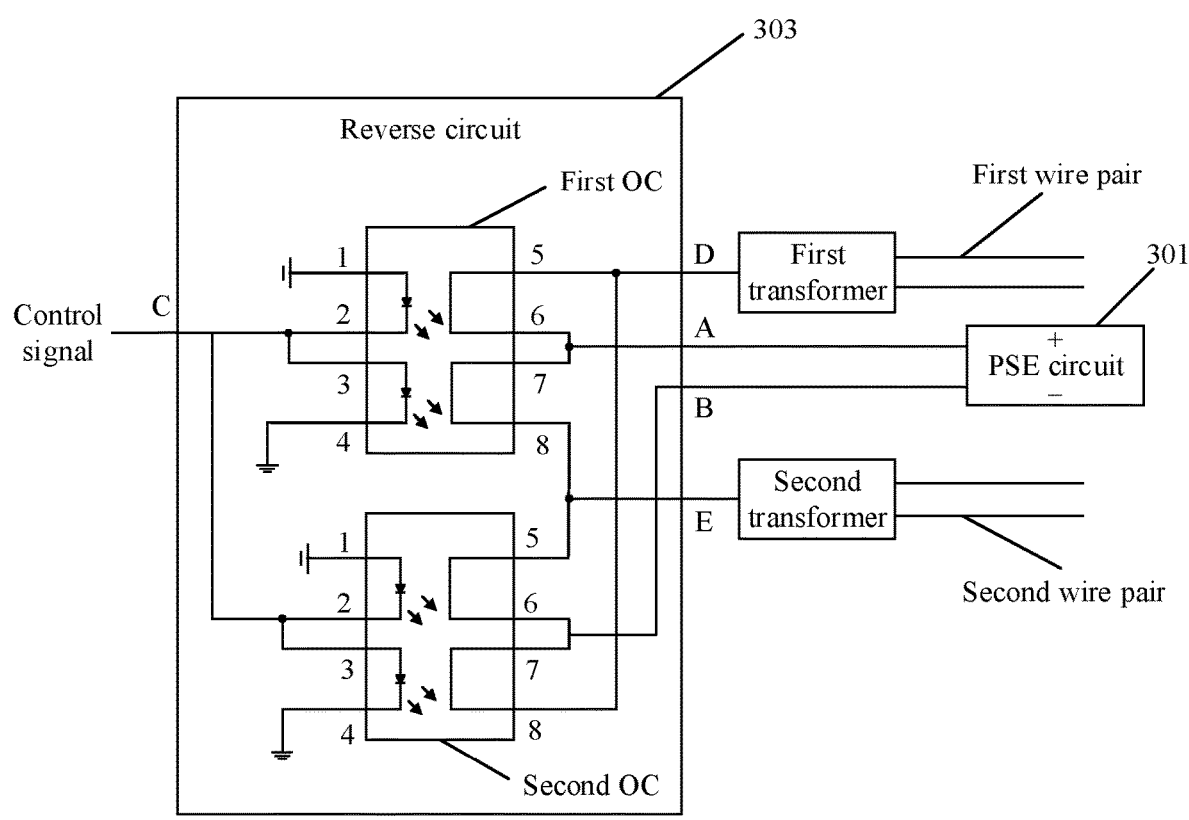
FIG. 4 is a schematic diagram of a structure of a reverse circuit according to an embodiment of this application.

FIG. 4 is a schematic diagram of a structure of a reverse circuit 303 according to an embodiment of this application. The circuit shown in FIG. 4 includes optical couplers OC 1 and OC 2. A and B, as input ports of the reverse circuit 303, are connected to power supply output ports of a PSE circuit 301, and may receive a first sounding electrical signal and a second sounding electrical signal that are output by the PSE circuit 301. C, as a control port of the reverse circuit 303, is connected to the PSE circuit 301 and is configured to receive a control signal sent by the PSE circuit 301. D and E, as output ports of the reverse circuit 303, are connected to a wire pair group by respectively using a first transformer and a second transformer, and may be configured to output the first sounding electrical signal or a second sounding electrical signal obtained after reverse processing. A first wire pair and a second wire pair constitute the wire pair group.

When the reverse circuit 303 shown in FIG. 4 is used to output the first sounding electrical signal and the second sounding electrical signal obtained after reverse processing to the wire pair group, A and B are used as single-phase input ports, D and E are used as single-phase output ports, and energy is transmitted from the PSE circuit 301 to a to-be-detected device through the wire pair group.

With reference to FIG. 4, the following uses an example in which the first sounding electrical signal and the second sounding electrical signal each include two electrical parameters to describe in detail an operating process of the reverse circuit provided in this embodiment of this application. Details are as follows:

In the reverse circuit 303 shown in FIG. 4, pins 1 of the first OC and the second OC each receive a high voltage. When a first electrical parameter of the first sounding electrical signal is output to the wire pair group by using the reverse circuit 303 shown in FIG. 4, the PSE circuit 301 outputs a low voltage control signal to the port C. In this case, pins 1 and 2 in the first OC are on, pins 3 and 4 in the first OC are off, a port that outputs a high electric potential and that is in the power supply output ports of the PSE circuit 301 is connected to the first transformer by using pins 5 and 6 corresponding to the pins 1 and 2 in the first OC, and an electrical parameter output by the high electric potential port is converted by the first transformer and then is output to two transmission wires in the first wire pair. Pins 1 and 2 in the second OC are on, pins 3 and 4 in the second OC are off, a port that outputs a low electric potential and that is in the power supply output ports of the PSE circuit 301 is connected to the second transformer by using pins 5 and 6 corresponding to the pins 1 and 2 in the second OC, and an electrical parameter output by the low electric potential port of the PSE circuit 301 is converted by the second transformer and then is output to two transmission wires in the second wire pair in the wire pair group. In this case, the first electrical parameter of the first sounding electrical signal output by the PSE circuit 301 is directly output to the wire pair group.

Similarly, a second electrical parameter in the first sounding electrical signal is output to the wire pair group in the foregoing manner.

When a first electrical parameter of the second sounding electrical signal obtained after reverse processing is output to the wire pair group by using the reverse circuit 303 shown in FIG. 4, the PSE circuit 301 outputs a high voltage control signal through the port C. In this case, the pins 1 and 2 in the first OC are off, the pins 3 and 4 in the first OC are on, the port that outputs a high electric potential and that is in the power supply output ports of the PSE circuit 301 is connected to the second transformer by using pins 7 and 8 corresponding to the pins 3 and 4 in the first OC, and an electrical parameter output by the high electric potential port is converted by the second transformer and then is output to the two transmission wires in the second wire pair. The pins 1 and 2 in the second OC are off, the pins 3 and 4 in the second OC are on, the port that outputs a low electric potential and that is in the power supply output ports of the PSE circuit 301 is connected to the first transformer by using pins 7 and 8 corresponding to the pins 3 and 4 in the second OC, and an electrical parameter output by the low electric potential port is converted by the first transformer and then is output to the two transmission wires in the first wire pair in the wire pair group. In this case, a polarity of a voltage received by the first wire pair and the second wire pair is opposite to a direction of an electrical parameter output by the power supply of the PSE circuit 301.

Similarly, a second electrical parameter in the second sounding electrical signal is sent to the wire pair group in the foregoing manner, so that the second sounding electrical signal sent by the PSE circuit 301 undergoes reverse processing, and is output to the wire pair group.

It can be learned from the foregoing operating process of the reverse circuit 303 that when the PSE circuit 301 provides different control signals for an output module, the reverse circuit 301 may implement connections between two ports of the power supply output ports of the PSE circuit 301 and different wire pairs by adjusting on and off of pins, so that the first sounding electrical signal is output to the wire pair group, and the second sounding electrical signal undergoes reverse processing and is output to the wire pair group.

Certainly, the foregoing description of the structure of the reverse circuit 303 is only an example. In actual application, the reverse circuit 303 may alternatively use another structure. For example, the reverse circuit 303 may use a relay, and change a control signal received by an input port of the relay, to output the first sounding signal to the wire pair group, perform reverse processing on the second sounding signal, and output the second sounding signal obtained after reverse processing to the wire pair group.

Figure 5:
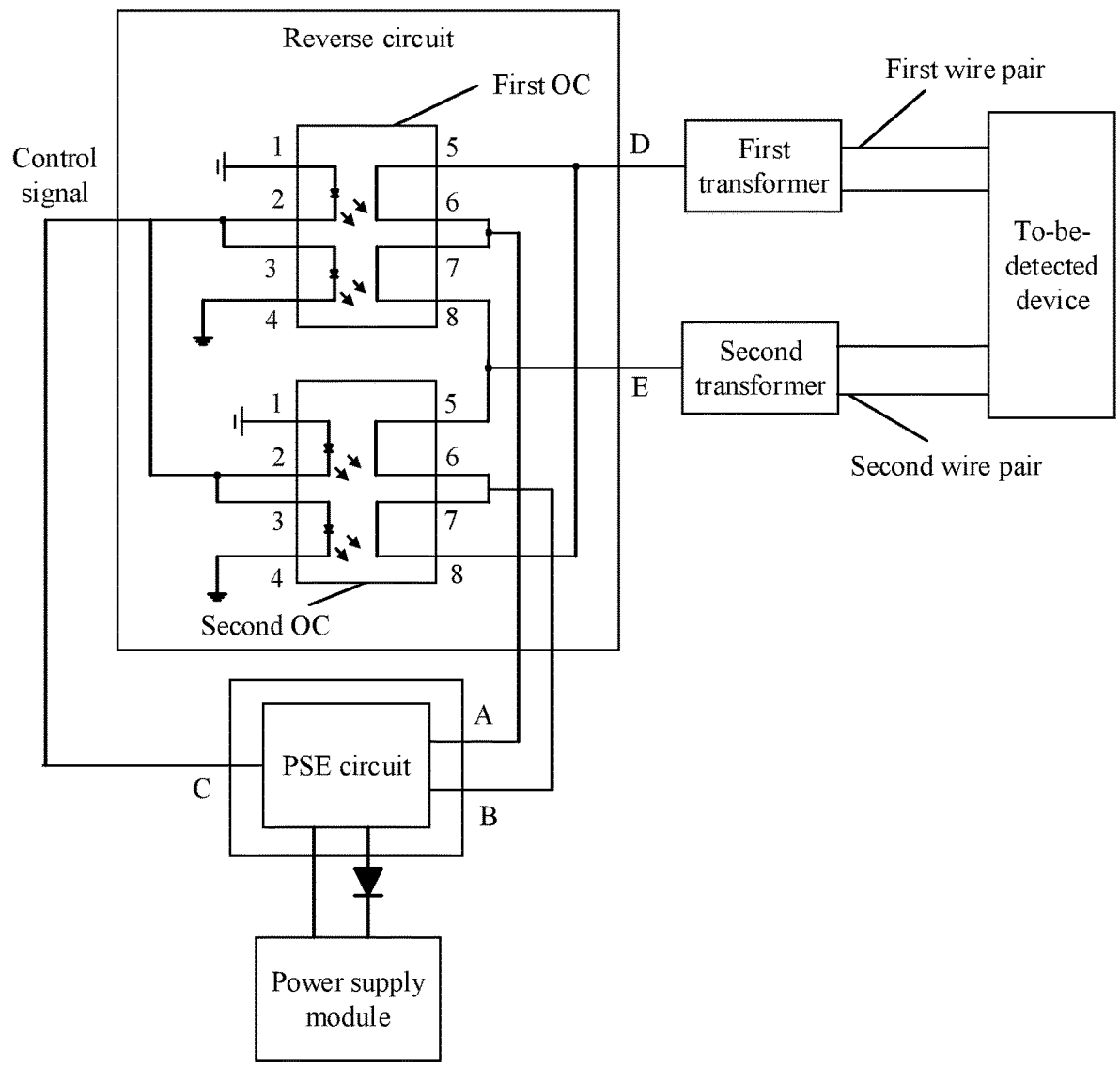
FIG. 5 is a schematic diagram 1 of a circuit structure of a power supply detection apparatus according to an embodiment of this application.

With reference to the foregoing description, for example, FIG. 5 is a diagram of a circuit structure of a power supply detection apparatus according to an embodiment of this application.

The power supply detection apparatus may include a PSE circuit, a power supply module, a diode D1, and a reverse circuit.

In the reverse circuit, a first OC and a second OC are included. Pins 1 of both the first OC and the second OC each have a high electrical potential, pins 2 and 3 each are configured to receive a control signal sent by the PSE circuit, and pins 4 each are grounded. In the first OC, a pin 5 is connected to the first wire pair by using the first transformer, pins 6 and 7 each are connected to a port A of the PSE circuit, and a pin 8 is connected to the second wire pair by using the second transformer. In the second OC, a pin 5 is connected to the second wire pair by using the second transformer, pins 6 and 7 each are connected to a port B of the PSE circuit, and a pin 8 is connected to a first wire pair by using a first transformer. The first wire pair and a second wire pair constitute a wire pair group, and are connected to a to-be-detected device. Each wire pair includes two transmission wires.

In the PSE circuit, A and B are used as power supply output ports of the PSE circuit, to output a first sounding electrical signal and a second sounding electrical signal, and C is used as a control port to output a control signal for the reverse circuit.

In the reverse circuit, the first sounding electrical signal and the second sounding electrical signal that are sent by the PSE circuit are received through the ports A and B of the PSE circuit. The control signal is received through the control port C of the PSE circuit. By using the control signal, the first sounding electrical signal is directly output to the first wire pair and the second wire pair by using the first transformer and the second transformer, reverse processing is performed on the second sounding electrical signal, and a second sounding electrical signal obtained after reverse processing is output to the first wire pair and the second wire pair by using the first transformer and the second transformer.

An anode of the diode D1 is connected to the PSE circuit, and a cathode is connected to the power supply module.

With reference to FIG. 5, the following uses an example in which the first sounding electrical signal and the second sounding electrical signal each include two electrical parameters to describe an operating principle of the power supply detection apparatus provided in this embodiment of this application.

In an example, when the PSE circuit outputs the first sounding electrical signal through the ports A and B, the PSE circuit outputs the first electrical parameter in the first sounding electrical signal, and provides a low voltage control signal to the first OC and the second OC through the port C. The pins 5 and 6 in the first OC are on, the pins 7 and 8 in the first OC are off, and the port A is connected to the first transformer through the pin 5. A high voltage signal output by the port A is converted by the first transformer and then is output to the two transmission wires in the first wire pair. The pins 5 and 6 in the second OC are on, the pins 7 and 8 in the second OC are off, and the port B is connected to the second transformer through the pin 8. A low voltage signal output by the port B is converted by the second transformer and then is output to the two transmission wires in the second wire pair. In an example, the first electrical parameter in the first sounding electrical signal is output to the wire pair group.

In the foregoing manner, the second electrical parameter in the first sounding electrical signal is output to the wire pair group, so that the first sounding electrical signal is directly output to the wire pair group by using the first transformer and the second transformer. The PSE circuit determines a forward sounding result of the first sounding electrical signal by using the first transformer and an electrical parameter on the transformer.

In an example, the PSE circuit may determine the forward sounding result of the first sounding electrical signal by using an electrical parameter on the output port of the reverse circuit.

When the PSE circuit outputs the second sounding electrical signal through the ports A and B, the PSE circuit outputs the first electrical parameter in the second sounding electrical signal, and provides a high voltage control signal to the first OC and the second OC through the port C. The pins 5 and 6 in the first OC are off, the pins 7 and 8 in the first OC are on, and the port A is connected to the second transformer through the pin 8. A high voltage signal output by the port A is converted by the second transformer and then is output to the two transmission wires in the second wire pair. The pins 5 and 6 in the second OC are off, the pins 7 and 8 in the second OC are on, and the port B is connected to the first transformer through the pin 8. A low voltage signal output by the port B is converted by the first transformer and then is output to the two transmission wires in the first wire pair. In an example, the first electrical parameter in the second sounding electrical signal undergoes reverse processing and is output to the wire pair group.

In the foregoing manner, the second electrical parameter in the second sounding electrical signal undergoes reverse processing and is output to the wire pair group, so that reverse processing is performed on the second sounding electrical signal, and the second sounding electrical signal obtained after reverse processing is output to the wire pair group. The PSE circuit determines a reverse sounding result of the second sounding electrical signal by using electrical parameters on the first transformer and the second transformer.

Figure 6:
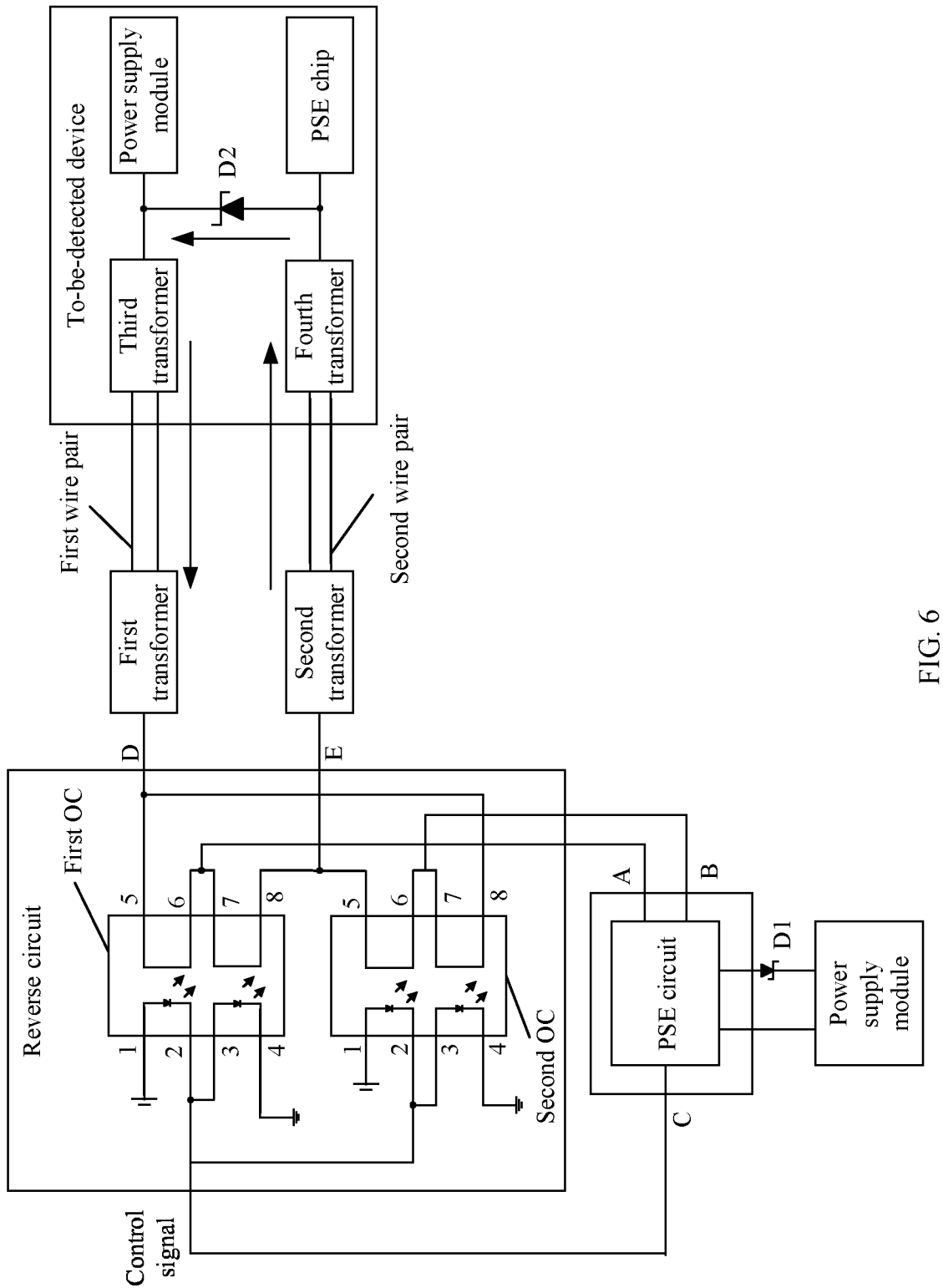
FIG. 6 is a schematic diagram 2 of a circuit structure of a power supply detection apparatus according to an embodiment of this application.

When the first sounding electrical signal or the second sounding electrical signal obtained after reverse processing is output to the to-be-detected device by using the wire pair group, if a polarity of the second sounding electrical signal obtained after reverse processing is opposite to a direction of receiving electric energy by the to-be-detected device and the to-be-detected device is PSE that is not powered on, as shown in FIG. 6, the second sounding electrical signal obtained after reverse processing is directly returned to the reverse circuit by using a diode D2, as shown by a path shown by an arrow in FIG. 6. In this case, the reverse sounding result of the to-be-detected device is a short circuit, and it can be determined that the to-be-detected device is a non-PD.

In an example, in the power supply detection apparatus provided in this embodiment of this application, it may be determined that the to-be-detected device is a non-PD when the forward sounding result of the first sounding electrical signal or the reverse sounding result of the second sounding electrical signal is a short circuit. In an example, power supply to the to-be-detected device is suspended, to improve accuracy of a detection result, and ensure power supply safety of the device.

In an example, to avoid a case in which the to-be-detected device is replaced, the first sounding electrical signal and the second sounding electrical signal obtained after reverse processing may be periodically provided for the to-be-detected device, to detect the to-be-detected device. A detection periodicity may be selected based on an application scenario of the power supply detection apparatus and performance of the to-be-detected device. Details are not described herein in this embodiment of this application.

Figure 7:
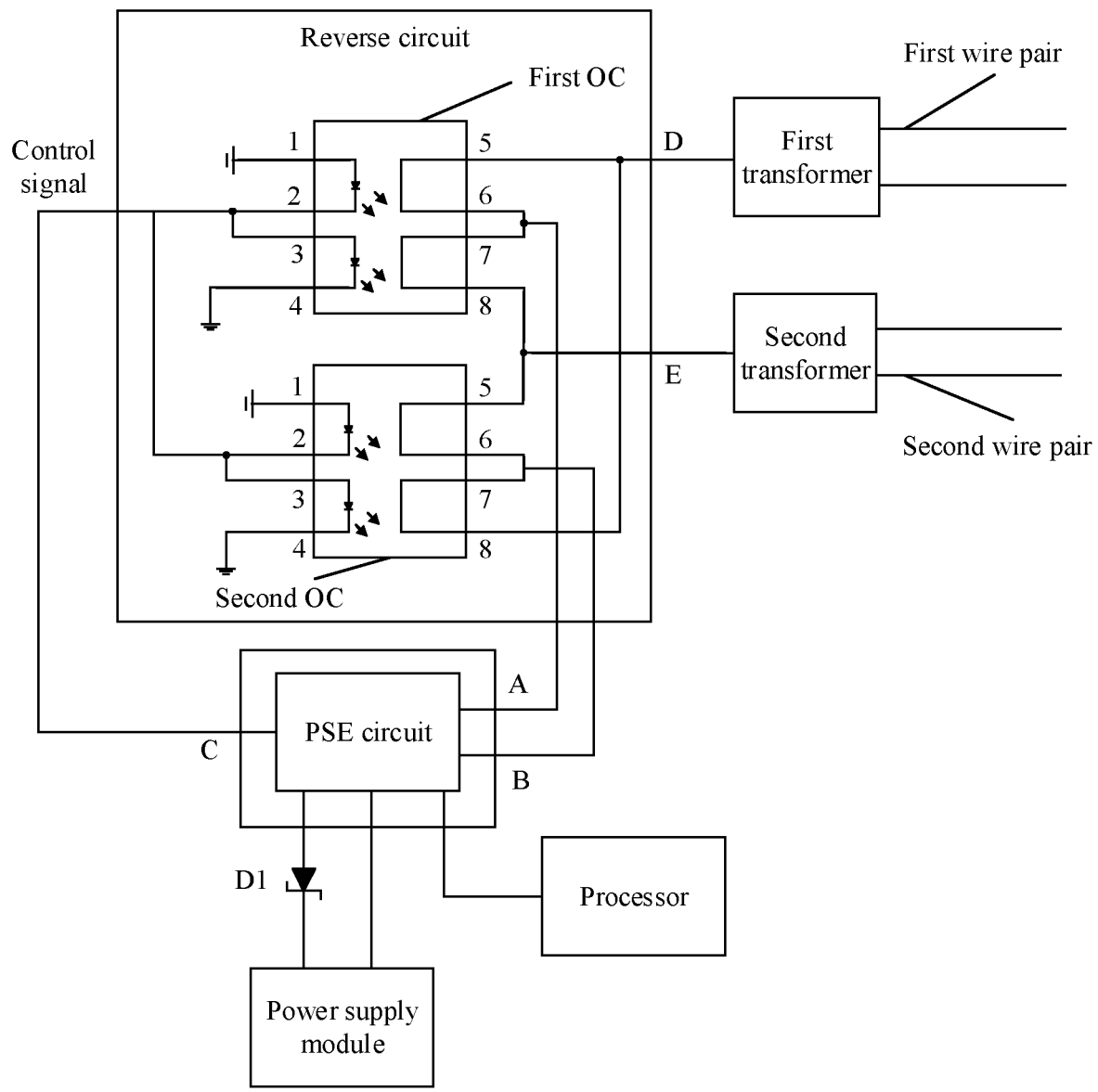
FIG. 7 is a schematic diagram 1 of a circuit structure of another power supply detection apparatus according to an embodiment of this application.

With reference to the descriptions of FIG. 3 and FIG. 4, for example, FIG. 7 is a diagram of a circuit structure of another power supply detection apparatus according to an embodiment of this application.

The power supply detection apparatus may include a PSE circuit, a power supply module, a diode D1, a processor, and a reverse circuit.

In the reverse circuit, a first OC and a second OC are included. Pins 1 of both the first OC and the second OC each have a high electrical potential, pins 2 and 3 each are configured to receive a control signal sent by the PSE circuit, and pins 4 each are grounded. In the first OC, a pin 5 is connected to a first wire pair by using a first transformer, pins 6 and 7 each are connected to a port A of the PSE circuit, and a pin 8 is connected to a second wire pair. In the second OC, a pin 5 is connected to the second wire pair by using a second transformer, pins 6 and 7 each are connected to a port B of the PSE circuit, and a pin 8 is connected to the first wire pair by using the first transformer. The first wire pair and the second wire pair constitute a wire pair group, and are connected to two power supply receiving ports of a to-be-detected device.

In the PSE circuit, A and B are used as power supply output ports of the PSE circuit, to output a first sounding electrical signal and a second sounding electrical signal, C is used as a control port to output a control signal for the reverse circuit, and a port F receives an instruction sent by the processor.

In the reverse circuit, the first sounding electrical signal and the second sounding electrical signal that are sent by the PSE circuit are received through the ports A and B of the PSE circuit. A control signal is received through the control port C of the PSE circuit. By using the control signal, the first sounding electrical signal is directly output to the first wire pair and the second wire pair by using the first transformer and the second transformer, reverse processing is performed on the second sounding electrical signal, and a second sounding electrical signal obtained after reverse processing is output to the first wire pair and the second wire pair by using the first transformer and the second transformer.

An anode of the diode D1 is connected to the PSE circuit, and a cathode is connected to the power supply module.

The processor is connected to the PSE circuit, and the processor uses the port F of the PSE circuit to implement that the PSE circuit controls the reverse circuit to directly output the first sounding electrical signal to the wire pair group by using the first transformer and the second transformer, perform reverse processing on the second sounding electrical signal, and output the second sounding electrical signal obtained after reverse processing to the wire pair group by using the first transformer and the second transformer.

With reference to FIG. 7, the following uses an example in which the first sounding electrical signal and the second sounding electrical signal each include two electrical parameters to describe an operating principle of the power supply detection apparatus provided in this embodiment of this application.

In an example, when the PSE circuit outputs the first sounding electrical signal through the ports A and B, the PSE circuit outputs a first electrical parameter in the first sounding electrical signal, and the processor controls the PSE circuit to provide a low voltage control signal to the first OC and the second OC through the control port C. The pins 5 and 6 in the first OC are on, the pins 7 and 8 in the first OC are off, and the port A is connected to the first transformer through the pin 5. A high voltage signal output by the port A is converted by the first transformer and then is output to two transmission wires in the first wire pair. The pins 5 and 6 in the second OC are on, the pins 7 and 8 in the second OC are off, and the port B is connected to the second transformer through the pin 8. A low voltage signal output by the port B is converted by the second transformer and then is output to two transmission wires in the second wire pair. In an example, the first electrical parameter in the first sounding electrical signal is output to the wire pair group.

In the foregoing manner, a second electrical parameter in the first sounding electrical signal is output to the wire pair group, so that the first sounding electrical signal is directly output to the wire pair group. The PSE circuit determines a forward sounding result of the first sounding electrical signal by using electrical parameters on the first transformer and the second transformer, and outputs the forward sounding result to the processor through the port F.

When the PSE circuit outputs the second sounding electrical signal through the ports A and B, the PSE circuit outputs a first electrical parameter in the second sounding electrical signal, and the processor controls the PSE circuit to provide a high voltage control signal to the first OC and the second OC through the control port C. The pins 5 and 6 in the first OC are off, the pins 7 and 8 in the first OC are on, and the port A is connected to the second transformer through the pin 8. A high voltage signal output by the port A is converted by the second transformer and then is output to the two transmission wires in the second wire pair. The pins 5 and 6 in the second OC are off, the pins 7 and 8 in the second OC are on, and the port B is connected to the first transformer through the pin 8. A low voltage signal output by the port B is converted by the first transformer and then is output to the two transmission wires in the first wire pair. In an example, the first electrical parameter in the second sounding electrical signal undergoes reverse processing and is output to the wire pair group.

In the foregoing manner, a second electrical parameter in the second sounding electrical signal undergoes reverse processing and is output to the wire pair group, so that reverse processing is performed on the second sounding electrical signal, and the second sounding electrical signal obtained after reverse processing is output to the wire pair group. The PSE circuit determines a reverse sounding result of the second sounding electrical signal by using the electrical parameters on the first transformer and the second transformer, and outputs the reverse sounding result to the processor through the port F.

When the first sounding electrical signal or the second sounding electrical signal obtained after reverse processing is output to the to-be-detected device by using the wire pair group, if a polarity of the second sounding electrical signal obtained after reverse processing is opposite to a direction of receiving electric energy by the to-be-detected device and the to-be-detected device is PSE that is not powered on, the second sounding electrical signal obtained after reverse processing is directly returned to the reverse circuit by using a diode D2. In this case, a sounding result of the to-be-detected device is a short circuit.

In an example, the processor may determine that the to-be-detected device is a non-PD when it is determined that the forward sounding result or the reverse sounding result is a short circuit.

In the power supply detection apparatus provided in this embodiment of this application, it may be determined that the to-be-detected device is a non-PD when the forward sounding result of the first sounding electrical signal or the reverse sounding result of the second sounding electrical signal obtained after reverse processing is a short circuit. In an example, power supply to the to-be-detected device is suspended, to improve accuracy of a detection result, and ensure power supply safety of the device.

Figure 8:
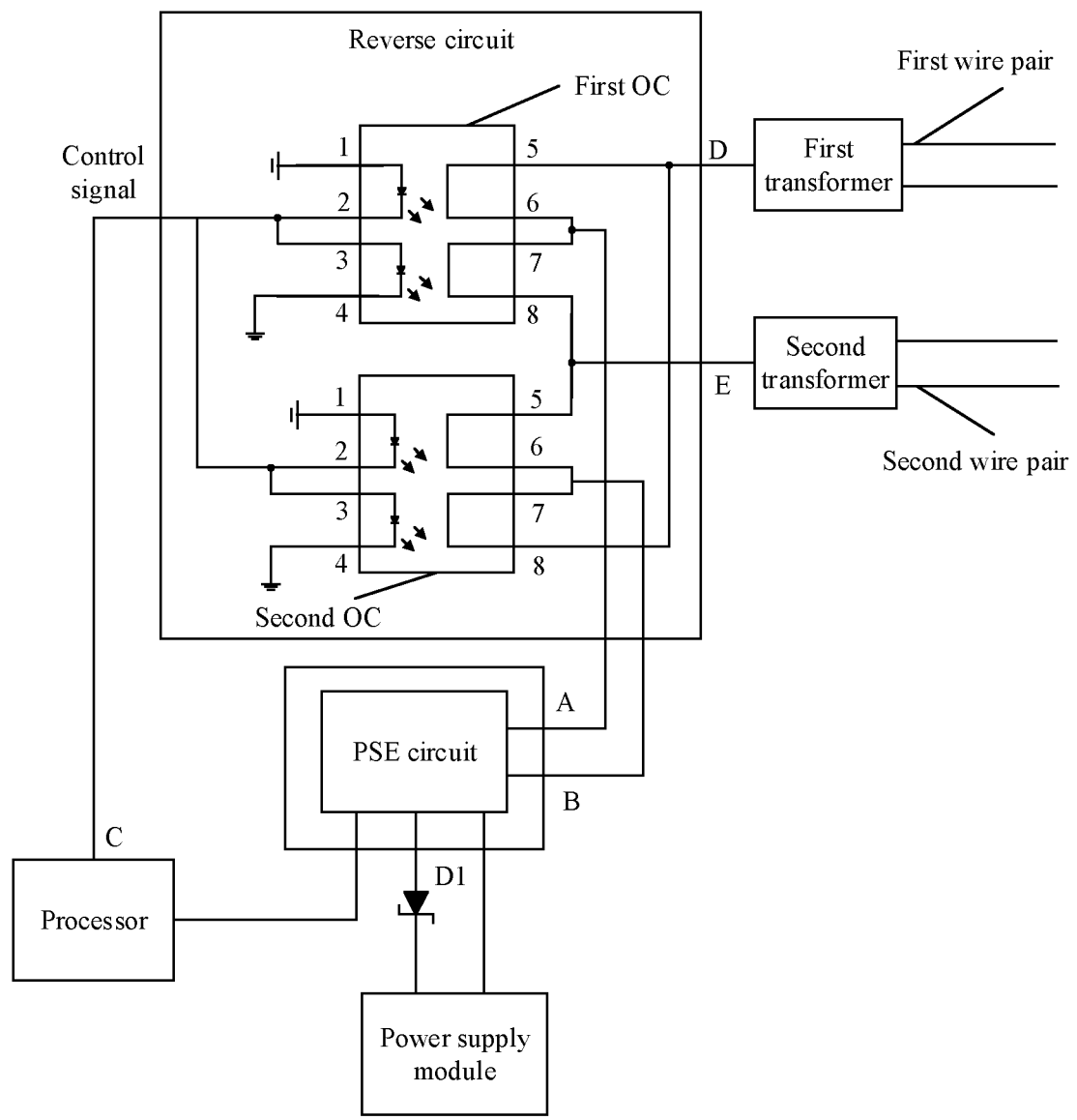
FIG. 8 is a schematic diagram 2 of a circuit structure of another power supply detection apparatus according to an embodiment of this application.

In some examples of this application, as shown in FIG. 8, the processor may be separately connected to the reverse circuit and the PSE circuit, and the processor may be configured to obtain the forward sounding result and the reverse sounding result from the PSE circuit. The processor is further configured to send a control signal to the reverse circuit, to directly control the reverse circuit to perform reverse processing on the second sounding electrical signal, output the second sounding electrical signal obtained after reverse processing to the wire pair group, and directly output the first sounding electrical signal to the wire pair group.

In an example, to avoid a case in which the to-be-detected device is replaced, the first sounding electrical signal and the second sounding electrical signal obtained after reverse processing may be periodically provided for the to-be-detected device, to detect the to-be-detected device. A detection periodicity may be selected based on an application scenario of the power supply detection apparatus and performance of the to-be-detected device. Details are not described herein in this embodiment of this application.

Based on an example of a concept, an embodiment of this application further provides a power supply chip. The power supply chip may include the power supply detection apparatus 300 provided in embodiments of this application. In an example, the PSE circuit, the power supply module, and the reverse circuit in the power supply detection apparatus 300 are integrated into the power supply chip.

Figure 9:
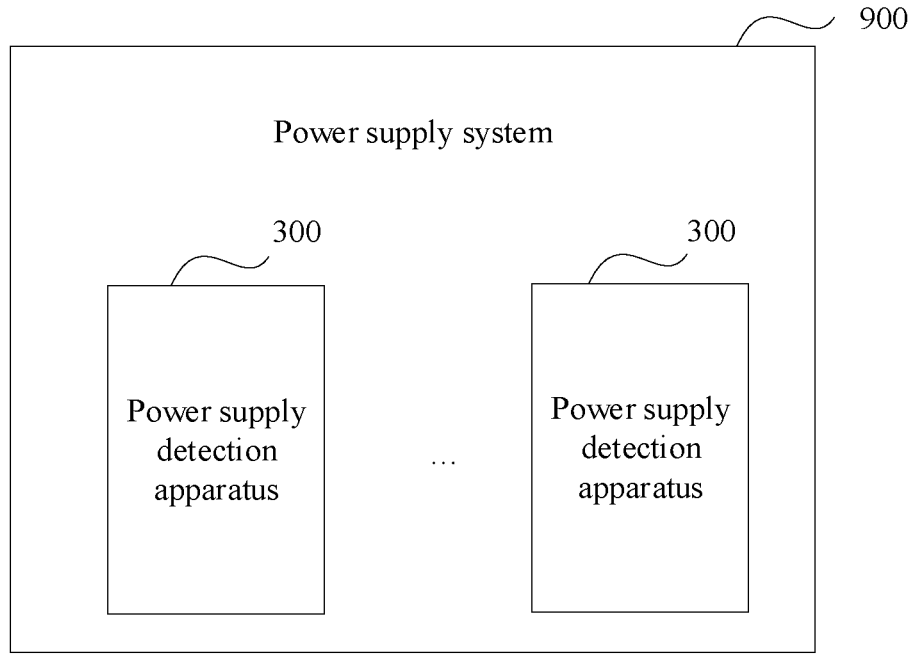
FIG. 9 is a schematic diagram of a structure of a power supply system according to an embodiment of this application.

Based on an example of a concept, an embodiment of this application further provides a power supply system. As shown in FIG. 9, the power supply system 900 may include a plurality of power supply detection apparatuses 300 provided in embodiments of this application.

Optionally, the power supply system 900 may further include a plurality of to-be-detected devices. Each power supply detection apparatus 300 of the plurality of power supply detection apparatuses 300 may be connected to one or more to-be-detected devices, to detect whether the to-be-detected devices are PDs.

Based on an example of a concept, an embodiment of this application further provides a power supply detection method. The power supply detection method may be performed by a network device in PoE. The network device may be the power supply detection apparatus provided in embodiments of this application.

Figure 10:
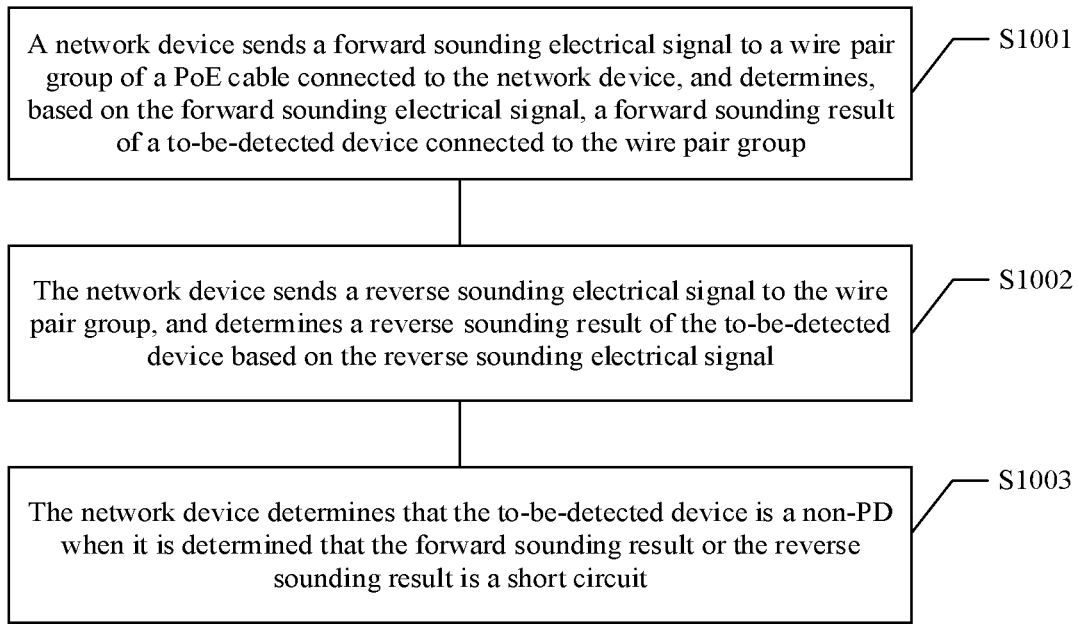
FIG. 10 is a schematic flowchart of a power supply detection method according to an embodiment of this application.

For example, FIG. 10 is a schematic flowchart of the power supply detection method according to this embodiment of this application. The method may include the following steps:

S1001: The network device sends a forward sounding electrical signal to a wire pair group of a PoE cable connected to the network device, and determines, based on the forward sounding electrical signal, a forward sounding result of a to-be-detected device connected to the wire pair group. The sounding result includes any one of the following: a PD, a non-PD, or a short circuit. The forward sounding electrical signal includes at least two electrical parameters. The electrical parameters may be but are not limited to a current and a voltage.

In an example, because the network device is connected to the wire pair group of the PoE cable and the wire pair group is connected to the to-be-detected device, the network device may determine the forward sounding result by using an electrical parameter on the wire pair group.

S1002: The network device sends a reverse sounding electrical signal to the wire pair group, and determines a reverse sounding result of the to-be-detected device based on the reverse sounding electrical signal. The reverse sounding electrical signal includes at least two electrical parameters. The electrical parameters may be but are not limited to a current and a voltage.

A first electrical parameter in the forward sounding electrical signal and a first electrical parameter in the reverse sounding electrical signal may be the same, and a second electrical parameter in the forward sounding electrical signal and a second electrical parameter in the reverse sounding electrical signal may be the same.

S1003: The network device determines that the to-be-detected device is a non-PD when it is determined that the forward sounding result or the reverse sounding result is a short circuit.

With reference to a circuit shown in FIG. 6, a reason to determine, based on the forward sounding result and the reverse sounding result of the to-be-detected device, whether the to-be-detected device is a PD device is described.

As shown in FIG. 6, when the forward sounding electrical signal or the reverse sounding electrical signal is output to the to-be-detected device by using the wire pair group, if a polarity of the reverse sounding electrical signal is opposite to a direction of receiving electric energy by the to-be-detected device and the to-be-detected device is PSE that is not powered on, the reverse sounding electrical signal is directly returned to the network device by using a diode D2. In this case, a sounding result of the to-be-detected device is a short circuit. In an example, it may be determined that the to-be-detected device is a non-PD when it is detected that the forward sounding result or the reverse sounding result is a short circuit. In an example, power supply to the to-be-detected device is suspended to ensure power supply safety of the device.

In an example, to avoid a case in which the to-be-detected device is replaced, the forward electrical signal and the reverse sounding electrical signal may be periodically provided for the to-be-detected device, to detect the to-be-detected device. A detection periodicity may be selected based on an application scenario of the power supply detection apparatus and performance of the to-be-detected device. Details are not described herein in this embodiment of this application.

Based on the foregoing embodiments, an embodiment of this application further provides a computer program product. When the computer program product is run by a PSE chip, the PSE chip is enabled to perform the following steps: sending a first sounding electrical signal and a first control signal, where the first control signal indicates a reverse circuit to directly output the first sounding signal; determining a forward sounding result based on the first sounding electrical signal, where the sounding result includes any one of the following: a PD, a non-PD, and a short circuit; sending a second sounding electrical signal and a second control signal, where the second control signal indicates the reverse circuit to perform reverse processing on the second sounding electrical signal; determining a reverse sounding result based on the second sounding electrical signal; and determining that the to-be-detected device is a non-PD when it is determined that the forward sounding result or the reverse sounding result is a short circuit.

Based on the foregoing embodiment, an embodiment of this application further provides another computer program product. When the computer program product is run by a processor, the processor is enabled to perform the following steps: indicating a PSE circuit to send a first sounding electrical signal, and indicating a reverse circuit to directly output the first sounding electrical signal; obtaining a first sounding electrical signal-based forward sounding result from the PSE circuit, where the sounding result includes any one of the following: a PD, a non-PD, and a short circuit; indicating the PSE circuit to send a second sounding electrical signal, and indicating the reverse circuit to perform reverse processing on the second sounding electrical signal; obtaining a second sounding electrical signal-based reverse sounding result from the PSE circuit; and determining that a to-be-detected device is a non-PD when the forward sounding result or the reverse sounding result is a short circuit.

A person skilled in the art should understand that embodiments of this application may be provided as a method, a system, or a computer program product. In an example, this application may use a form of a hardware-only embodiment, a software-only embodiment, or an embodiment with a combination of software and hardware. In addition, this application may use a form of a computer program product that is implemented on one or more computer-usable storage media (including but not limited to a disk memory, a compact click (CD)-Read-only memory (ROM), an optical memory, and the like) that include computer-usable program code.

This application is described with reference to the flowcharts and/or block diagrams of the method, the device (system), and the computer program product according to embodiments of this application. It should be understood that computer program instructions may be used to implement each process and/or each block in the flowcharts and/or the block diagrams and a combination of a process and/or a block in the flowcharts and/or the block diagrams. The computer program instructions may be provided for a general-purpose computer, a dedicated computer, an embedded processor, or a processor of another programmable data processing device to generate a machine, so that the instructions executed by the computer or the processor of another programmable data processing device generate an apparatus for implementing a specific function in one or more processes in the flowcharts and/or in one or more blocks in the block diagrams.

The computer program instructions may alternatively be stored in a computer-readable memory that can indicate a computer or another programmable data processing device to work in a specific manner, so that the instructions stored in the computer-readable memory generate an artifact that includes an instruction apparatus. The instruction apparatus implements a specific function in one or more processes in the flowcharts and/or in one or more blocks in the block diagrams.

The computer program instructions may alternatively be loaded onto a computer or another programmable data processing device, so that a series of operations and steps are performed on the computer or another programmable device, so that computer-implemented processing is generated. In an example, the instructions executed on the computer or another programmable device provide steps for implementing a specific function in one or more processes in the flowcharts and/or in one or more blocks in the block diagrams.

A person skilled in the art may make various modifications and variations to embodiments of this application without departing from the scope of the claims. In this case, this application is intended to cover these modifications and variations of embodiments of this application provided that they fall within the scope of protection defined by the following claims and their equivalent technologies.

What is claimed is:

1. A power supply detection apparatus comprising:
a power sourcing equipment (PSE) circuit configured to:
send a first sounding electrical signal and a second sounding electrical signal; and
determine, based on the first sounding electrical signal, a forward sounding result of a to-be-detected device configured to connect to an Ethernet cable, wherein the forward sounding result indicates a powered device (PD) connection of the to-be-detected device, a non-PD connection of the to-be-detected device, or a short circuit connection of the to-be-detected device;
a power supply connected to the PSE circuit, wherein the power supply is configured to supply power to the PSE circuit;
a reverse circuit comprising:
a first optical coupler connected to the PSE circuit and configured to:
receive the first sounding electrical signal; and
directly output the first sounding electrical signal to a wire-pair group of the Ethernet cable; and
a second optical coupler coupled to the first optical coupler and to the PSE circuit and configured to:
receive the second sounding electrical signal;
perform reverse processing on the second sounding electrical signal to obtain a reverse-processed sounding electrical signal; and
output the reverse-processed sounding electrical signal to the wire-pair group, wherein the PSE circuit is further configured to determine a reverse sounding result of the to-be-detected device based on the reverse-processed sounding electrical signal, and wherein the power supply detection apparatus is configured to determine that the to-be-detected device is a non-PD when the forward sounding result is the short circuit connection or the reverse sounding result is the short circuit connection; and a diode, wherein the diode comprises:
  an anode connected to the PSE circuit; and
  a cathode connected to the power supply for protecting the power supply from damage from reverse voltage when the to-be-detected device is another PSE circuit.

2. The power supply detection apparatus of claim 1, wherein the reverse circuit is further configured to:
receive a control signal from the PSE; and
perform reverse processing on the second sounding electrical signal in response to receiving the control signal.

3. The power supply detection apparatus of claim 1, wherein the PSE circuit comprises power supply output ports, wherein the power supply output ports comprise a first electric potential port configured to output a high electric potential,
  wherein the first optical coupler comprises:
    a first input port configured to connect to the PSE circuit;
    a second input port configured to connect to a ground;
    a first output port comprising:
      a first end point configured to connect to a first wire-pair in the wire-pair group; and
      a second end point connected to the first electric potential port that outputs the high electric potential and that is in the power supply output ports of the PSE circuit; and
    a second output port comprising:
      a third end point connected to the first electric potential port; and
      a fourth end point configured to connect to a second wire-pair in the wire-pair group; and
  wherein the second optical coupler comprises:
    a third input port connected to the PSE circuit;
    a fourth input port configured to connect to the ground;
    a third output port comprising:
      a fifth end point configured to connect to the second wire-pair; and
      a sixth end point configured to connect to a second electric potential port that is configured to output a low electric potential and that is in the power supply output ports of the PSE circuit; and
    a fourth output port comprising:
      a seventh end point connected to the second electric potential port; and
      an eighth end point configured to connect to the first wire-pair.

4. The power supply detection apparatus of claim 1, further comprising a processor configured to:
obtain the forward sounding result from the PSE circuit;
obtain the reverse sounding result from the PSE circuit; and
determine that the to-be-detected device is a non-PD when the forward sounding result is the short circuit connection or the reverse sounding result is the short circuit connection.

5. The power supply detection apparatus of claim 4, wherein the processor is further configured to instruct the reverse circuit to perform reverse processing on the second sounding electrical signal.

6. The power supply detection apparatus of claim 1, further comprising determining that the to-be-detected device is the non-PD based on a resistance value of the wire-pair group or a capacitance value of the wire-pair group.

7. A power supply chip, comprising:
  a power supply detection apparatus comprising:
    a power sourcing equipment (PSE) circuit configured to:
      send a first sounding electrical signal and a second sounding electrical signal; and
      determine, based on the first sounding electrical signal, a forward sounding result of a to-be-detected device connected to an Ethernet cable, wherein the forward sounding result indicates a powered device (PD) connection of the to-be-detected device, a non-PD connection of the to-be-detected device, or a short circuit connection of the to-be-detected device;
    a power supply connected to the PSE circuit, wherein the power supply is configured to supply power to the PSE circuit;
    a reverse circuit comprising:
      a first optical coupler connected to the PSE circuit and configured to:
        receive the first sounding electrical signal; and
        directly output the first sounding electrical signal to a wire-pair group of the Ethernet cable; and
      a second optical coupler coupled to the first optical coupler and to the PSE circuit and configured to:
        receive the second sounding electrical signal;
        perform reverse processing on the second sounding electrical signal to obtain a reverse-processed sounding electrical signal; and
        output the reverse-processed sounding electrical signal to the wire-pair group,
    wherein the PSE circuit is further configured to determine a reverse sounding result of the to-be-detected device based on the reverse-processed sounding electrical signal, and
    wherein the power supply detection apparatus is configured to determine that the to-be-detected device is a non-PD when the forward sounding result is the short circuit connection or the reverse sounding result is the short circuit connection; and
  a diode, wherein the diode comprises:
    an anode connected to the PSE circuit; and
    a cathode connected to the power supply for protecting the power supply from damage from reverse voltage when the to-be-detected device is another PSE circuit.

8. The power supply chip of claim 7, wherein the reverse circuit is further configured to:
receive a control signal from the PSE; and
perform reverse processing on the second sounding electrical signal in response to receiving the control signal.

9. The power supply chip of claim 7, wherein the PSE circuit comprises power supply output ports, wherein the power supply output ports comprise a first electric potential port configured to output a high electric potential,
  wherein the first optical coupler comprises:
    a first input port configured to connect to the PSE circuit;

a second input port configured to connect to a ground;
a first output port comprising:
  a first end point configured to connect to a first wire-pair in the wire-pair group; and
  a second end point configured to connect to the first electric potential port that outputs the high electric potential and that is in the power supply output ports of the PSE circuit; and
a second output port comprising:
  a third end point configured to connect to the first electric potential port; and
  a fourth end point configured to connect to a second wire-pair in the wire-pair group; and
wherein the second optical coupler comprises:
  a third input port connected to the PSE circuit;
  a fourth input port configured to connect to the ground;
  a third output port comprising:
    a fifth end point configured to connect to the second wire-pair; and
    a sixth end point configured to connect to a second electric potential port that is configured to output a low electric potential and that is in the power supply output ports of the PSE circuit; and
  a fourth output port comprising:
    a seventh end point configured to connect to the second electric potential port; and
    an eighth end point configured to connect to the first wire-pair.

10. The power supply chip of claim 7, wherein the power supply detection apparatus further comprises a processor, and wherein the processor is configured to:
  obtain the forward sounding result from the PSE circuit;
  obtain the reverse sounding result from the PSE circuit; and
  determine that the to-be-detected device is a non-PD when the forward sounding result is the short circuit connection or the reverse sounding result is the short circuit connection.

11. The power supply chip of claim 10, wherein the processor is further configured to instruct the reverse circuit to perform reverse processing on the second sounding electrical signal.

12. The power supply chip of claim 7, wherein the power supply detection apparatus is further configured to determine that the to-be-detected device is the non-PD based on a resistance value of the wire-pair group or a capacitance value of the wire-pair group.

13. A power supply detection method implemented by a network device, wherein the power supply detection method comprises:
  providing a power sourcing equipment (PSE) circuit;
  supplying, via a power supply connected to the PSE circuit, power to the PSE circuit;
  provide a diode connected to the PSE circuit;
  sending, by a power sourcing equipment (PSE) circuit via a first optical coupler of a reverse circuit, a forward sounding electrical signal to a wire-pair group of an Ethernet cable;
  receiving, by the first optical coupler of the reverse circuit from the PSE circuit and based on the forward sounding electrical signal, a forward sounding result of a to-be-detected device that is configured to connect to the wire-pair group, wherein the forward sounding result indicates a powered device (PD) connection, a non-PD connection, or a short circuit connection;
  sending, by the PSE circuit via a second optical coupler of the reverse circuit, a reverse sounding electrical signal to the wire-pair group;
  receiving, from the PSE circuit and based on the reverse sounding electrical signal, a reverse sounding result of the to-be-detected device,
  wherein the to-be-detected device indicates a non-PD when the forward sounding result is the short circuit connection or the reverse sounding result is the short circuit connection;
  connecting an anode of the diode to the PSE circuit; and
  connecting a cathode of the diode to the power supply for protecting the power supply from damage from reverse voltage when the to-be-detected device is another PSE circuit.

14. The power supply detection method of claim 13, further comprising sending a first control signal, wherein the first control signal instructs the reverse circuit configured to connect to the network device to directly output the forward sounding electrical signal to the wire-pair group of the Ethernet cable.

15. The power supply detection method of claim 14, further comprising sending a second control signal, wherein the second control signal instructs the reverse circuit to perform reverse processing on the reverse sounding electrical signal.

16. The power supply detection method of claim 13, further comprising determining that the to-be-detected device is the non-PD based on a resistance value of the wire-pair group or a capacitance value of the wire-pair group.

17. The power supply detection method of claim 13, further comprising:
  receiving the forward sounding result;
  receiving the reverse sounding result; and
  determine that the to-be-detected device indicates a non-PD when the forward sounding result is the short circuit connection or the reverse sounding result is the short circuit connection.

18. The power supply detection method of claim 13, further comprising instructing the reverse circuit of the network device to directly send the forward sounding electrical signal to the wire-pair group.

* * * * *